United States Patent
Ha et al.

(10) Patent No.: US 10,651,172 B2
(45) Date of Patent: May 12, 2020

(54) SEMICONDUCTOR DEVICE AND METHOD OF MANUFACTURING THE SAME

(71) Applicant: SAMSUNG ELECTRONICS CO., LTD., Suwon-si, Gyeonggi-do (KR)

(72) Inventors: Taewon Ha, Seongnam-si (KR); Juyoun Kim, Suwon-si (KR); Sang Min Lee, Seoul (KR); Moon-Sun Hong, Suwon-si (KR); Seki Hong, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/174,702

(22) Filed: Oct. 30, 2018

(65) Prior Publication Data

US 2019/0189613 A1 Jun. 20, 2019

(30) Foreign Application Priority Data

Dec. 15, 2017 (KR) ........................ 10-2017-0173118

(51) Int. Cl.
*H01L 27/088* (2006.01)
*H01L 21/28* (2006.01)
(Continued)

(52) U.S. Cl.
CPC .... *H01L 27/0886* (2013.01); *H01L 21/28158* (2013.01); *H01L 21/82345* (2013.01); *H01L 21/823431* (2013.01); *H01L 21/823437* (2013.01); *H01L 21/823462* (2013.01); *H01L 21/823821* (2013.01); *H01L 21/823842* (2013.01); *H01L 27/088* (2013.01); *H01L 27/092* (2013.01); *H01L 29/41791* (2013.01); *H01L 29/517* (2013.01); *H01L 29/66795* (2013.01); *H01L 29/785* (2013.01)

(58) Field of Classification Search
CPC ....... H01L 21/82345; H01L 21/823842; H01L 21/823821; H01L 21/823431; H01L 21/823437; H01L 27/0886; H01L 29/66795; H01L 29/785; H01L 29/41791
See application file for complete search history.

(56) References Cited

U.S. PATENT DOCUMENTS 8,012,827 B2 9/2011 Yu et al.
8,637,359 B2 1/2014 Chang et al.
(Continued)

FOREIGN PATENT DOCUMENTS

KR 10-0351252 B1 8/2002
KR 10-2007-0071544 A 7/2007

*Primary Examiner* — Hsien Ming Lee
(74) *Attorney, Agent, or Firm* — Lee IP Law, P.C.

(57) ABSTRACT

A semiconductor device includes a substrate having an active region, and first to third transistors on the active region of the substrate, each of the first to third transistors including a dielectric layer on the substrate, a metal layer on the dielectric layer, a barrier layer between the dielectric layer and the metal layer, and a work function layer between the dielectric layer and the barrier layer, wherein the barrier layer of the third transistor is in contact with the dielectric layer of the third transistor, and wherein a threshold voltage of the second transistor is greater than a threshold voltage of the first transistor and less than a threshold voltage of the third transistor.

9 Claims, 8 Drawing Sheets

(51) Int. Cl.
*H01L 29/51* (2006.01)
*H01L 29/417* (2006.01)
*H01L 21/8234* (2006.01)
*H01L 29/78* (2006.01)
*H01L 29/66* (2006.01)
*H01L 21/8238* (2006.01)
*H01L 27/092* (2006.01)

(56) References Cited

U.S. PATENT DOCUMENTS

| | | |
|---|---|---|
| 8,865,581 B2 | 10/2014 | Clark |
| 8,969,965 B2 | 3/2015 | Chang et al. |
| 9,040,404 B2 | 5/2015 | Ando et al. |
| 9,070,785 B1 | 6/2015 | Niimi et al. |
| 9,105,497 B2 | 8/2015 | Hong et al. |
| 9,269,786 B2 | 2/2016 | Chou et al. |
| 9,412,743 B2 | 8/2016 | Lai et al. |
| 9,721,847 B2 | 8/2017 | Niimi et al. |
| 2019/0157165 A1* | 5/2019 | Kim ............... H01L 21/823842 |

* cited by examiner

SEMICONDUCTOR DEVICE AND METHOD OF MANUFACTURING THE SAME

CROSS-REFERENCE TO RELATED APPLICATION

Korean Patent Application No. 10-2017-0173118, filed on Dec. 15, 2017, in the Korean Intellectual Property Office, and entitled: Semiconductor Device and Method of Manufacturing the Same, incorporated by reference herein in its entirety.

BACKGROUND

1. Field

The present disclosure relates to a semiconductor device and a method of manufacturing the same, and more particularly, to a semiconductor device having a three-dimensional channel and a method of manufacturing the same.

2. Description of the Related Art

A semiconductor device may include an integrated circuit having metal oxide semiconductor field effect transistors (MOSFETs). As the semiconductor device becomes highly integrated, the scale down of the MOSFETs is being accelerated, which may deteriorate operating characteristics of the semiconductor device, e.g., it may be difficult to achieve high performance of the MOSFETs to meet customer's requirements.

SUMMARY

According to exemplary embodiments, a semiconductor device may include a substrate having an active region, and first to third transistors on the active region of the substrate. Each of the first to third transistors may include a dielectric layer on the substrate; a metal layer on the dielectric layer, and a barrier layer between the dielectric layer and the metal layer. Each of the first and second transistors may further include a work function layer between the dielectric layer and the barrier layer. The barrier layer of the third transistor may be in contact with the dielectric layer. A threshold voltage of the second transistor may be greater than a threshold voltage of the first transistor and less than a threshold voltage of the third transistor.

According to exemplary embodiments, a method of manufacturing a semiconductor device may include defining first to third regions on which first to third transistors are respectively formed, forming a first conductive layer on the first to third regions; removing the first conductive layer from the second region, and thereafter forming a second conductive layer on the first to third regions, removing the first and second conductive layers from the first region, and thereafter forming a third conductive layer on the first to third regions, forming an upper work function layer on the third conductive layer, forming a lower barrier layer on the upper work function layer, removing the first to third conductive layers, the upper work function layer, and the lower barrier layer from the third region, and thereafter forming an upper barrier layer on the first to third regions, and forming a metal layer on the first to third regions.

According to exemplary embodiments, a semiconductor device may include a substrate having an active region, and first to fourth transistors on the active region of the substrate and having different work functions from each other. Each of the first to fourth transistors may include a fin on the substrate, a dielectric layer on the fin, and a gate electrode on the dielectric layer. The gate electrode of each of the first to third transistors may include a metal layer on the dielectric layer, and a work function layer between the dielectric layer and the metal layer. The gate electrode of the fourth transistor may include a metal layer on the dielectric layer and does not include the work function layer.

BRIEF DESCRIPTION OF THE DRAWINGS

Features will become apparent to those of ordinary skill in the art by describing in detail exemplary embodiments with reference to the attached drawings, in which.

DETAILED DESCRIPTION

A semiconductor device according to embodiments will now be described hereinafter with reference to accompanying drawings.

Figure 1:
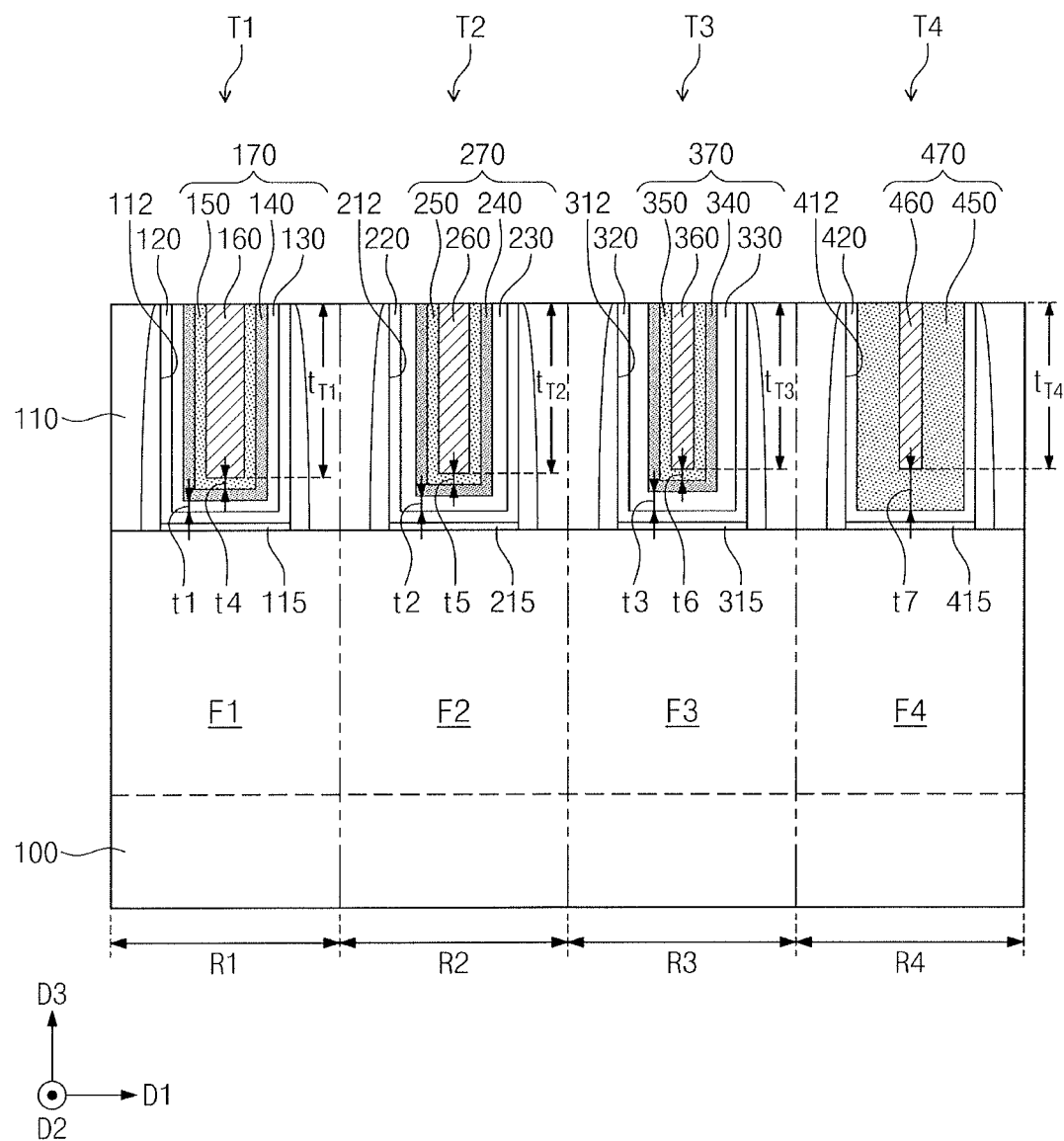
FIG. 1 illustrates a cross-sectional view of a semiconductor device according to exemplary embodiments.
Figure 2:
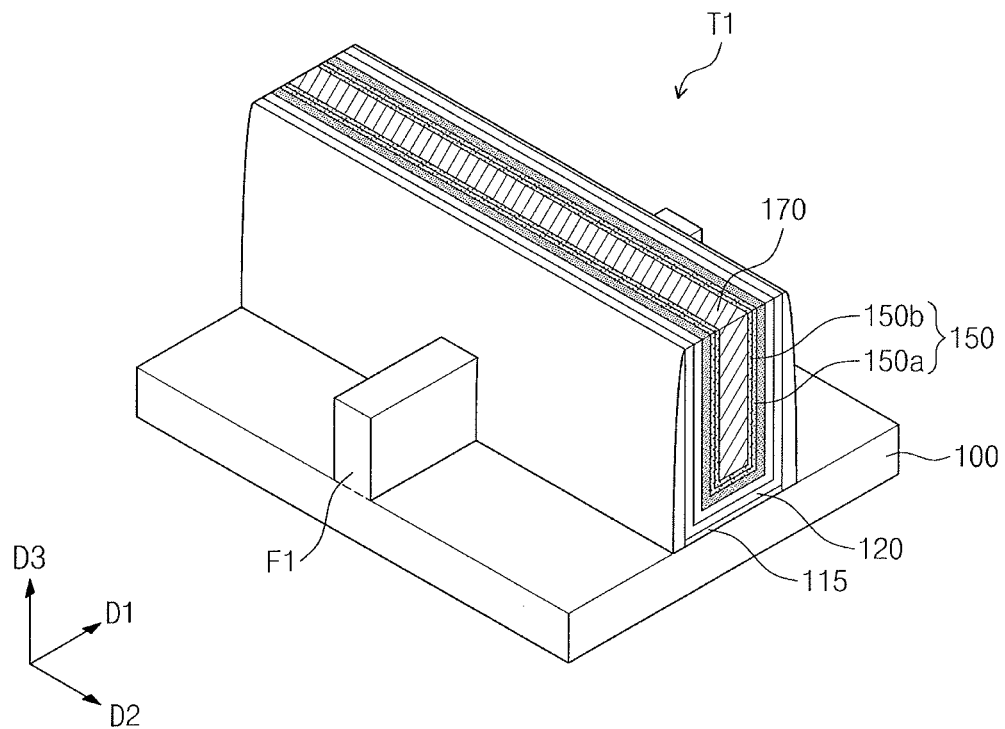
FIG. 2 illustrates an enlarged perspective view of a first transistor of FIG. 1.
Figure 3:
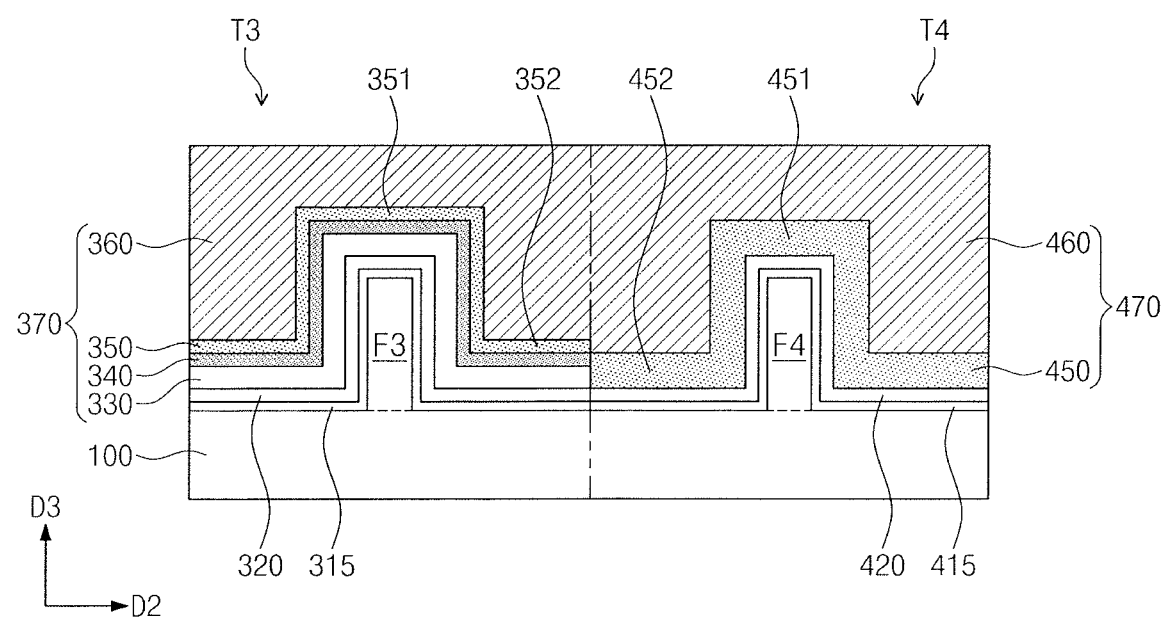
FIG. 3 illustrates a cross-sectional view of third and fourth transistors of FIG. 1.

FIG. 1 illustrates a cross-sectional view showing a semiconductor device according to exemplary embodiments. FIG. 2 illustrates an enlarged perspective view showing a first transistor of FIG. 1. FIG. 3 illustrates a cross-sectional view showing third and fourth transistors of FIG. 1. FIG. 3 shows cross-sections of the third and fourth transistors taken along a second direction. It is noted that an interlayer dielectric layer 110 is eliminated from FIG. 2 for clarity of illustration of the first transistor.

Referring to FIG. 1, a substrate 100 may be provided. The substrate 100 may have an active region. The substrate 100 may be or include a semiconductor substrate. The semiconductor substrate may be, e.g., a bulk silicon substrate, a silicon-on-insulator (SOI) substrate, a germanium substrate, a germanium-on-insulator (GOI) substrate, a silicon-germanium substrate, or an epitaxial thin-layer substrate obtained by performing a selective epitaxial growth (SEG) process. For example, the bulk silicon substrate may be doped with n-type or p-type impurities. In another example, the semiconductor substrate may be a III-V group compound semiconductor substrate. For example, the III-V group compound semiconductor substrate may include one or more of gallium arsenide (GaAs), indium gallium arsenide (InGaAs), aluminum gallium arsenide (AlGaAs), and a mixture thereof.

The substrate 100 may be provided thereon with first to fourth transistors T1, T2, T3, and T4 having threshold voltages that are different from each other. This description explains an embodiment provided with four transistors T1 to T4, but embodiments are not limited thereto.

The first to fourth transistors T1 to T4 may be provided respectively on first to fourth regions R1, R2, R3, and R4 of the substrate 100. Each of the first to fourth transistors T1 to T4 may be a fin-type transistor, e.g., a p-channel MOSFET, having a three-dimensional channel. The first and second transistors T1 and T2 may be N-type transistors, and the third and fourth transistors T3 and T4 may be P-type transistors. The second transistor T2 may have a threshold voltage greater than that of the first transistor T1, the third transistor T3 may have a threshold voltage greater than that of the second transistor T2, and the fourth transistor T4 may have a threshold voltage greater than that of the third transistor T3. The first transistor T1 will now be discussed as a representative of the first to fourth transistors T1 to T4, and the second to fourth transistors T2 to T4 will be explained in comparison with the first transistor T1. The first transistor T1 will be representatively described hereinafter with reference to FIG. 2, and structural features shown in FIG. 2 may be substantially the same as or similar to those of the second to fourth transistors T2 to T4.

Referring to FIGS. 1 and 2, the first transistor T1 may include a first fin F1, a first trench 112, a first interface layer 115, a first dielectric layer 120, and a first gate electrode 170 that are provided on the first region R1 of the substrate 100.

The first fin F1 may be provided on the substrate 100. The first fin F1 may extend in a first direction D1 on the substrate 100. The first fin F1 may be a portion of the substrate 100 and/or an epitaxial layer grown from the substrate 100. For example, the first fin F1 may include a semiconductor material, e.g., silicon (Si) or germanium (Ge). In another example, the first fin F1 may include a compound semiconductor, e.g., IV group compound semiconductor or III-V group compound semiconductor. For example, the IV group compound semiconductor may include a binary or ternary compound including two or more of carbon (C), silicon (Si), germanium (Ge), and tin (Sn), or such binary or ternary compound doped with IV group element. For example, the III-V group compound semiconductor may include one of binary, ternary, and quaternary compounds that is formed when one or more of III group elements, e.g., aluminum (Al), gallium (Ga), and indium (In), are combined with one of V group elements, e.g., phosphorous (P), arsenic (As) and antimony (Sb).

The interlayer dielectric layer 110 may be disposed on the substrate 100, as illustrated in FIG. 1. The first trench 112 may be provided in the interlayer dielectric layer 110. The first trench 112 may extend in a second direction D2 intersecting the first direction D1 (i.e., into the page of FIG. 1).

The first interface layer 115 may be disposed in the first trench 112. The first interface layer 115 may, e.g., completely, cover a floor, e.g., bottom, surface of the first trench 112 and expose an inner sidewall of the first trench 112. The first interface layer 115 may include, e.g., a silicon oxide layer. For example, the first interface layer 115 may be formed using chemical oxidation, UV oxidation, dual plasma oxidation, or the like.

The first dielectric layer 120 may be disposed along the inner sidewall of the first trench 112. e.g., the first dielectric layer 120 may be disposed on the first interface layer 115 and along the inner sidewall of the first trench 112 exposed by the first interface layer 115. For example, the first dielectric layer 120 may conformally cover the inner sidewall and bottom surface of the first trench 112. The first dielectric layer 120 may be formed using, e.g., chemical vapor deposition (CVD), atomic layer deposition (ALD), or the like. The first dielectric layer 120 may include a high-k dielectric layer. For example, the first dielectric layer 120 may include hafnium (Hf) or zirconium (Zr). In some embodiments, the first dielectric layer 120 may include one or more of, e.g., hafnium oxide ($HfO_2$), hafnium silicon oxide ($HfSiO_2$), hafnium oxynitride (HfON), zirconium oxide ($ZrO_2$), zirconium silicon oxide ($ZrSiO_4$), tantalum oxide ($Ta_2O_5$), titanium oxide ($TiO_2$), barium strontium titanium oxide (BSTO), barium titanium oxide ($BaTiO_3$), strontium titanium oxide ($SrTiO_3$), yttrium oxide ($Y_2O_3$), lead scandium tantalum oxide (PST), and lead zinc niobate (PZN).

The first gate electrode 170 may be disposed in the first trench 112. The first gate electrode 170 may include a first lower work function layer 130, a first upper work function layer 140, a first barrier layer 150, and a first metal layer 160.

The first lower work function layer 130 may be disposed on the first dielectric layer 120 in the first trench 112. The first lower work function layer 130 may be formed, e.g., conformally, along the sidewall and the bottom surface of the first trench 112. The first lower work function layer 130 may be formed using, e.g., chemical vapor deposition (CVD), atomic layer deposition (ALD), or the like. The first lower work function layer 130 may include one or more of binary metal nitride. e.g., titanium nitride (TiN) and tantalum nitride (TaN), ternary metal nitride. e.g., titanium aluminum nitride (TiAlN), tantalum nitride (TaAlN), titanium silicon nitride (TiSiN) and tantalum silicon nitride (TaSiN), and oxide thereof.

The first upper work function layer 140 may be disposed on the first lower work function layer 130 in the first trench 112. The first upper work function layer 140 may be formed, e.g., conformally, along the sidewall and the bottom surface of the first trench 112. The first upper work function layer 140 may have a work function less than that of the first lower work function layer 130. The first upper work function layer 140 may be formed using, e.g., chemical vapor deposition (CVD), atomic layer deposition (ALD), or the like. The first upper work function layer 140 may include one or more of an aluminum-containing binary metallic material, e.g., titanium aluminum carbide (TiAlC), titanium aluminum nitride (TiAlN), titanium aluminum carbon nitride (TiAlCN), or titanium aluminum (TiAl), an oxide thereof, a nitride thereof, and a carbide thereof.

The first barrier layer 150 may be disposed on the first upper work function layer 140 in the first trench 112. The first barrier layer 150 may be formed, e.g., conformally, along the sidewall and the bottom surface of the first trench 112. The first barrier layer 150 may be formed using, e.g., chemical vapor deposition (CVD), atomic layer deposition (ALD), or the like. For example, as illustrated in FIG. 2, the first barrier layer 150 may include a first lower barrier layer 150a and a first upper barrier layer 150b on the first lower barrier layer 150a. The first lower barrier layer 150a and the first upper barrier layer 150b may include titanium nitride (TiN) or titanium (Ti). The first lower barrier layer 150a and the first upper barrier layer 150b may include different constituent materials from each other in accordance with embodiments. Structural features of the first barrier layer 150, which includes the first lower barrier layer 150a and the first upper barrier layer 150b, will be explained together with descriptions of a method of manufacturing a semiconductor device.

The first metal layer 160 may be disposed on the first barrier layer 150 in the first trench 112. The first metal layer 160 may fill an unoccupied portion of the first trench 112. The first metal layer 160 may include. e.g., tungsten (W) or aluminum (Al).

The second transistor T2 may have substantially the same configuration as that of the first transistor T1. The second transistor T2 may include a second fin F2, a second trench 212, a second interface layer 215, a second dielectric layer 220, and a second gate electrode 270. The second gate electrode 270 may include a second lower work function layer 230, a second upper work function layer 240, a second barrier layer 250, and a second metal layer 260.

The second lower work function layer 230 of the second transistor T2 may have a thickness t2 greater than a thickness t1 of the first lower work function layer 130 of the first transistor T1. The second barrier layer 250 of the second transistor T2 may have a thickness t5 the same as a thickness t4 of the first barrier layer 150 of the first transistor T1. Therefore, the second metal layer 260 of the second transistor T2 may have a thickness $t_{T2}$ less than a thickness $t_{T1}$ of the first metal layer 160 of the first transistor T1. Each of the thicknesses $t_{T1}$ and $t_{T2}$ of the first and second metal layers 160 and 260 may be defined as a thickness of the first and second metal layers 160 and 260 measured along a third direction D3, i.e., a perpendicular direction from the substrate 100, and the same may be true of thicknesses of third and fourth metal layers 360 and 460 discussed below.

The third transistor T3 may have substantially the same configuration as that of the first transistor T1. The third transistor T3 may include a third fin F3, a third trench 312, a third interface layer 315, a third dielectric layer 320, and a third gate electrode 370. The third gate electrode 370 may include a third lower work function layer 330, a third upper work function layer 340, a third barrier layer 350, and a third metal layer 360.

The third lower work function layer 330 of the third transistor T3 may have a thickness t3 greater than the thickness t2 of the second lower work function layer 230 of the second transistor T2. The third barrier layer 350 of the third transistor T3 may have a thickness t6 the same as the thickness t5 of the second barrier layer 250 of the second transistor T2. The third metal layer 360 of the third transistor T3 may have a thickness $t_{T3}$ less than the thickness $t_{T2}$ of the second metal layer 260.

The fourth transistor T4 may have substantially the same configuration as that of the first transistor T1, except for work function layers. The fourth transistor T4 may include a fourth fin F4, a fourth trench 412, a fourth interface layer 415, a fourth dielectric layer 420, and a fourth gate electrode 470. The fourth gate electrode 470 may include a fourth barrier layer 450 and a fourth metal layer 460. Differently from the first to third transistors T1 to T3, the fourth barrier layer 450 of the fourth transistor T4 may not be configured to include a plurality of barrier layers (e.g., may not include a lower barrier layer or an upper barrier layer). The fourth barrier layer 450 may include substantially the same material as those of the first to third upper barrier layers 150, 250, and 350. The fourth barrier layer 450 may have a thickness t7 greater than each of the thicknesses t4, t5, and t6 of the first, second, and third barrier layers 150, 250, and 350, respectively. For example, the thickness t7 of the fourth barrier layer 450 may be substantially the same as a sum of the thickness t3 of the third lower work function layer 330, a thickness of the third upper work function layer 340, and the thickness t6 of the third barrier layer 350. The fourth transistor T4 may be provided without work function layers, and as a result, the fourth barrier layer 450 may be in direct contact with the fourth dielectric layer 420. The fourth metal layer 460 of the fourth transistor T4 may have a thickness $t_{T4}$ the same as the thickness $t_{T3}$ of the third metal layer 360 of the third transistor T3.

As illustrated in FIG. 3, the above structural features may allow the fourth barrier layer 450 to have a top surface level that is substantially equal to or lower than that of a top surface of the third barrier layer 350. For example, the fourth barrier layer 450 may have a first segment 451 on the fourth fin F4, and the third barrier layer 350 may have a first segment 351 on the third fin F3, such that a topmost surface of the first segment 351 may be at a level higher than or the same as that of a topmost surface of the first segment 451 of the fourth barrier layer 450. Similarly, the third barrier layer 350 may also have a second segment 352 spaced apart in the second direction D2 from the third fin F3, such that a topmost surface of the second segment 352 may be at a level higher than or the same as that of a topmost surface of a second segment 452 of the fourth barrier layer 450, which is spaced apart in the second direction D2 from the fourth fin F4. It is noted that FIG. 3 does not show a boundary at which the third transistor T3 and the fourth transistor T4 are in direct contact with each other; rather, the third gate electrode 370 and the fourth gate electrode 470 may be electrically separated from each other.

The first to fourth transistors T1 to T4 may be partially configured the same as each other. For example, the first to fourth fins F1 to F4 may be of the same material and shape. The first to fourth interface layers 115, 125, 135, and 145 may be of the same material and shape.

The first to third lower work function layers 130, 230, and 330 may be of the same material as each other, but of different thicknesses from each other as discussed above with respect to the first to fourth transistors T1 to T4. For example, the thickness t2 of the second lower work function layer 230 may be greater than the thickness t1 of the first lower work function layer 130 and less than the thickness t3 of the third lower work function layer 330. In contrast, the first to third upper work function layers 140, 240, and 340 may be of the same material and thickness.

The first to third lower barrier layers of the first to third barrier layers 150, 250, 350, respectively, may be of the same material and shape. The first to third upper barrier layers of the first to third barrier layers 150, 250, 350, respectively, and the fourth barrier layer 450 may be of the same material. As discussed above with respect to the first to fourth transistors T1 to T4, the first to third upper barrier layers may have the same thickness, and the fourth barrier layer 450 may have a thickness greater than those of the first to third upper work function layers 140, 240, and 340.

As discussed above, a semiconductor device according to embodiments may be provided with transistors having threshold voltages that are different from each other due to differences in thicknesses of work function layers of the transistors. When at least one of the work functions layers is adjusted to have a different thickness, the work function layers may be controlled to have different effective work functions from each other. It may, therefore, be possible to control the threshold voltages of the transistors.

When a number of transistors increases in a semiconductor device, the thickness of the work function layer may gradually increase for the increase in the threshold voltage of the transistor. In this case, a trench may have a wide space for accommodating a gate electrode, which configuration may increase sizes of the transistors, thereby causing a spatial limitation that may limit the increase in threshold voltage variation and an increase in gate resistance. Further, when a lower work function layer has a great thickness, a work function control element (e.g., lanthanum (La) or aluminum (Al)) may have a difficulty in diffusing from an upper work function layer toward the lower work function layer, and thus it may not be easy to control effective work functions of the work function layers.

In contrast, according to embodiments, a semiconductor device may be provided with the fourth transistor T4, which has a great threshold voltage, that is formed when work function control layers are removed and then filled with the barrier layer 450. It may not be necessary that the work function control layers have great thicknesses to provide the great threshold voltage for the fourth transistor T4. For example, the fourth gate electrode 470 of the fourth transistor T4 may have no large total thickness. In this case, the fourth gate electrode 470 may be received within the fourth trench 412 whose space is small, and thus transistors may decrease in thicknesses. As a result, according to embodiments, a semiconductor device may be provided to include highly integrated transistors having different threshold voltages.

Further, since work function layers do not need to have great thicknesses to provide the great threshold voltage for the fourth transistor T4, the fourth gate electrode 470 of the fourth transistor T4 may have low electrical resistance. The fourth transistor T4 may increase in electrical characteristics accordingly. Moreover, according to embodiments, since the thickness of the barrier layer 450 is used to control an effective work function, the fourth transistor T4 may be easy to control its threshold voltage.

Figure 4:
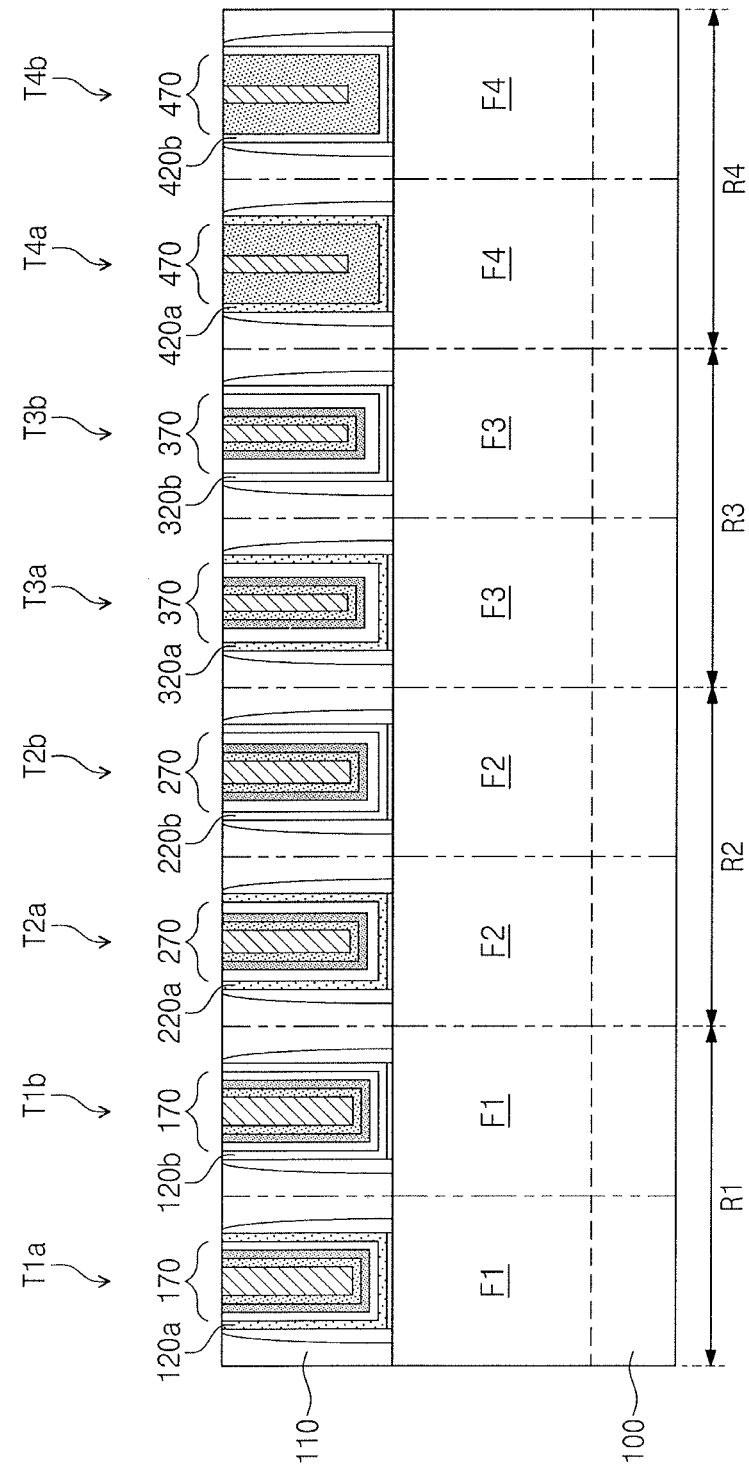
FIG. 4 illustrates a cross-sectional view of a semiconductor device according to exemplary embodiments.

FIG. 4 illustrates a cross-sectional view showing a semiconductor device according to exemplary embodiments. At least one of first to fourth dielectric layers may be doped with a work function control element, which doping may allow the first to fourth dielectric layers to have different effective work functions from each other. First to fourth transistors may therefore be controlled in their threshold voltages.

Referring to FIG. 4, each of first to fourth transistors may be provided in plural. The following description will focus on first transistors T1a and T1b, and the same may also be true of second transistors T2a and T2b, third transistors T3a and T3b, and fourth transistors T4a and T4b.

One transistor T1a of the first transistors T1a and T1b may include a first dielectric layer 120a containing a work function control element. For example, the first dielectric layer 120a of the first transistor T1a may include a high-k dielectric layer including hafnium (Hf) or zirconium (Zr), and may be doped with a work function control element, e.g., lanthanum (La) or aluminum (Al). When the first dielectric layer 120a is doped with the work function control element, the first dielectric layer 120a may decrease in effective work function. The first transistor T1a whose first dielectric layer 120a is doped with the work function control element may have a threshold voltage less than that of other first transistor T1b whose first dielectric layer 120b is not doped with the work function control element.

Similarly to the first transistors T1a and T1b, the substrate 100 may be provided thereon with a plurality of second transistors T2a and T2b, a plurality of third transistors T3a and T3b, and a plurality of fourth transistors T4a and T4b, and a work function control element may be doped into dielectric layers 220a, 320a, and 420a of ones of the second to fourth transistors T2a, T2b, T3a, T3b, T4a, and T4b. For example, one transistor T2a of the second transistors T2a and T2b may include a second dielectric layer 220a containing a work function control element. The second transistor T2a may have a threshold voltage less than that of other second transistor T2b and greater than that of the first transistor T1b. One transistor T3a of the third transistors T3a and T3b may include a third dielectric layer 320a containing a work function control element. The third transistor T3a may have a threshold voltage less than that of other third transistor T3b and greater than that of the second transistor T2b. One transistor T4a of the fourth transistors T4a and T4b may include a fourth dielectric layer 420a containing a work function control element. The fourth transistor T4a may have a threshold voltage less than that of other fourth transistor T4b. A semiconductor device may include the transistors T1a, T1b, T2a, T2b, T3a, T3b, T4a, and T4b whose threshold voltages are different, without structural changes.

A semiconductor device according to some embodiments may include the transistors T1a, T1b, T2a, T2b, T3a. T3b. T4a, and T4b having different threshold voltages and reduced sizes, thereby increasing in integration and electrical characteristics.

FIGS. 5 to 16 illustrate cross-sectional views showing stages in a method of manufacturing a semiconductor device, according to exemplary embodiments. As illustrated in FIG. 1, in order to form dielectric layers, gate electrodes, and the like in trenches, it may be required that a plurality of material layers be sequentially stacked to conform to shapes of the trenches. However, for convenience of illustration, each material layer will be shown as a flat plate.

Figure 5:
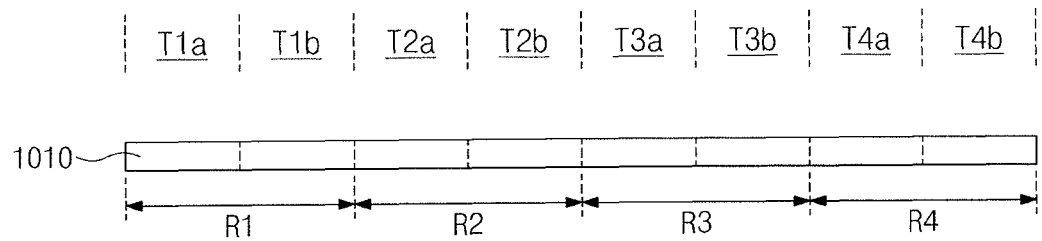
FIGS. 5 to 16 illustrate cross-sectional views of stages in a method of manufacturing a semiconductor device according to exemplary embodiments.

Referring to FIG. 5, the substrate 100 of FIG. 1 may be provided with defined first through fourth regions R1 through R4 therein. The first region R1 may be defined as a zone where the first transistors T1a and T1b are formed, the second region R2 may be defined as a zone where the second transistors T2a and T2b are formed, the third region R3 may be defined as a zone where the third transistors T3a and T3b are formed, and the fourth region R4 may be defined as a zone where the fourth transistors T4a and T4b are formed.

A preliminary dielectric layer 1010 may be formed in a plurality of trenches formed on the first to fourth regions R1 to R4. The preliminary dielectric layer 1010 may include a high-k dielectric layer. For example, the preliminary dielectric layer 1010 may include hafnium (Hf) or zirconium (Zr). The preliminary dielectric layer 1010 may be formed using, e.g., chemical vapor deposition (CVD), atomic layer deposition (ALD), or the like.

Figure 6:
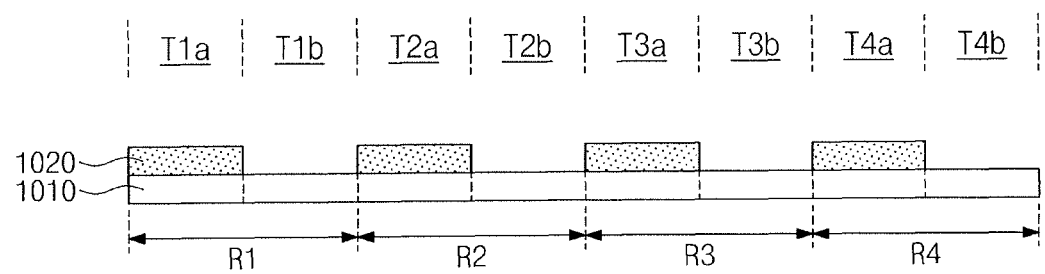

Referring to FIG. 6, a work function control element layer 1020 may be formed in the plurality of trenches formed on the first to fourth regions R1 to R4. The work function control element layer 1020 may be formed on portions of the first to fourth regions R1 to R4 on which portions the first to fourth transistors T1a, T2a, T3a, and T4a are to be formed. The work function control element layer 1020 may include a work function control element. e.g., lanthanum (La), lanthanum oxide (LaO), or aluminum oxide (AlO). The work function control element layer 1020 may be formed using, e.g., chemical vapor deposition (CVD), atomic layer deposition (ALD), or the like.

Figure 7:
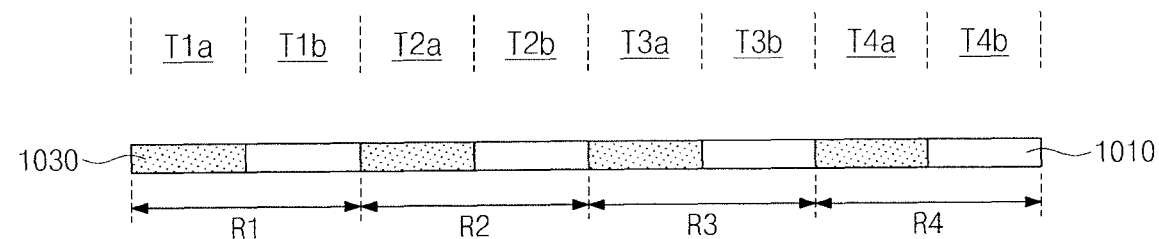

Referring to FIG. 7, drive-in annealing may be performed such that the work function control element (e.g., La or Al) may diffuse in a preliminary dielectric layer 1030 of the first to fourth regions R1 to R4. The work function control element may not diffuse in other preliminary dielectric layer of portions of the first to fourth regions R1 to R4 on which portions the first to fourth transistors T1b, T2b, T3b, and T4b are to be formed.

Figure 8:
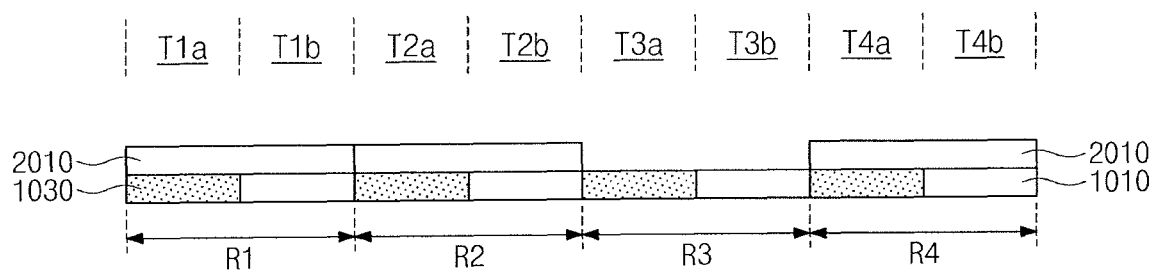

Referring to FIG. 8, a first conductive layer 2010 may be formed on the first, second, and fourth regions R1, R2, and R4. For example, a conductive layer may be formed on the first to fourth regions R1 to R4, and then an etching process may be performed to remove the conductive layer from the third region R3.

Figure 9:
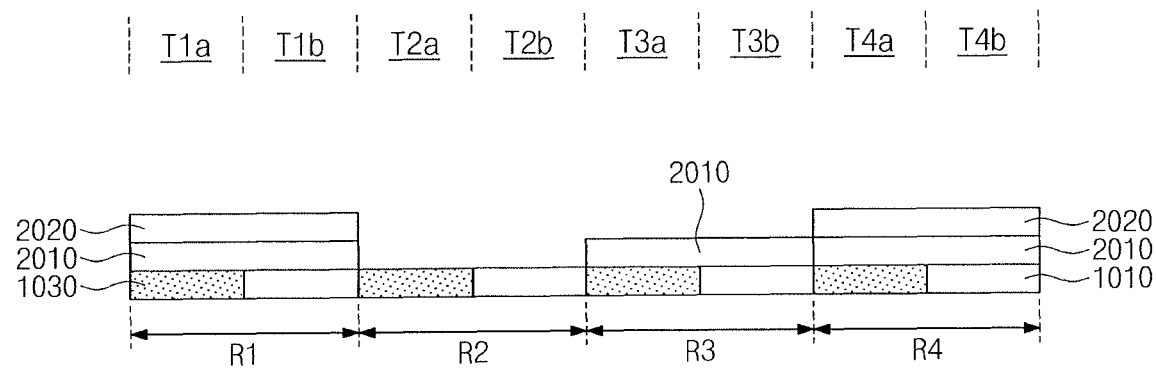

Referring to FIG. 9, a second conductive layer 2020 may be formed on the first, third, and fourth regions R1, R3, and R4. For example, a conductive layer may be formed on the first to fourth regions R1 to R4, and then an etching process may be performed to remove the conductive layer from the second region R2. When the conductive layer is removed from the second region R2, the first conductive layer 2010 may also be removed from the second region R2.

Figure 10:
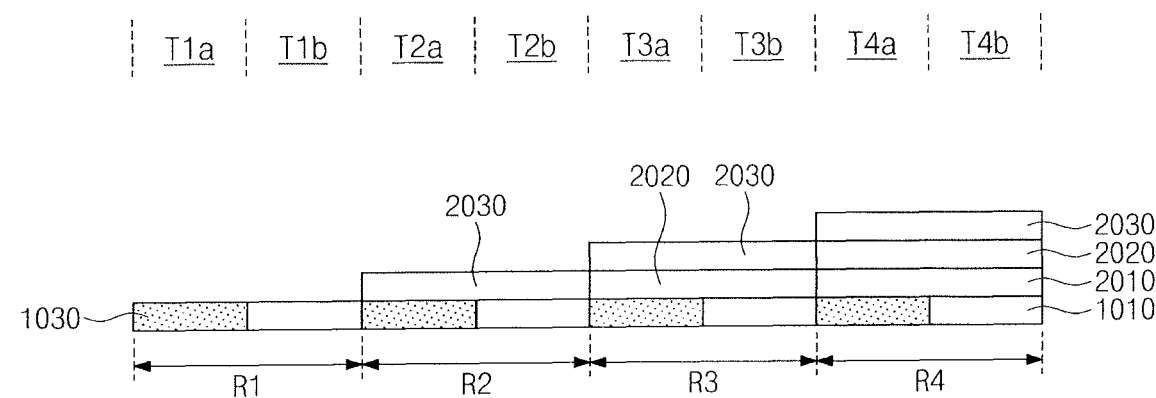

Referring to FIG. 10, a third conductive layer 2030 may be formed on the second, third, and fourth regions R2, R3, and R4. For example, a conductive layer may be formed on the first to fourth regions R1 to R4, and then an etching process may be performed to remove the conductive layer from the first region R1. When the conductive layer is removed from the first region R1, the first and second conductive layers 2010 and 2020 may also be removed from the first region R1.

Figure 11:
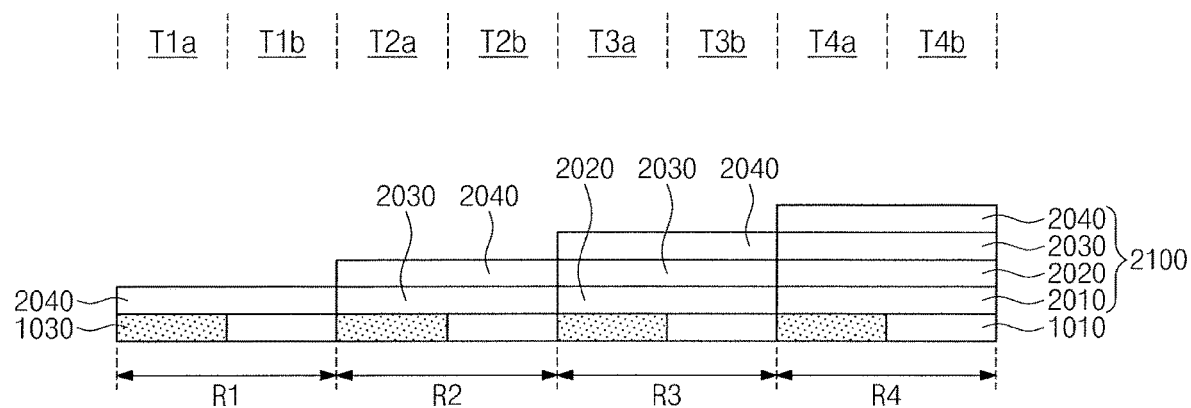

Referring to FIG. 11, a third conductive layer 2040 may be formed on the first to fourth regions R1 to R4. e.g., the third conductive layer 2040 may have a step structure on the first to fourth regions R1 to R4. The first to fourth conductive layers 2010, 2020, 2030, and 2040 may be formed of the same material. For example, the first to fourth conductive layers 2010, 2020, 2030, and 2040 may include one or more of binary metal nitride (e.g., TiN or TaN), ternary metal nitride (e.g., TiAlN, TaAlN, TiSiN, or TaSiN), and oxide thereof.

The aforementioned process may form a lower preliminary work function layer 2100 whose thickness is different on the first to fourth regions R1 to R4, e.g., gradually increasing from the first to fourth regions R1 to R4. For example, the first region R1 may be provided thereon with the fourth conductive layer 2040 alone, the second region R2 may be provided thereon with the third and fourth conductive layers 2030 and 2040 stacked in sequence, the third region R3 may be provided thereon with the second to fourth conductive layers 2020, 2030, and 2040 stacked in sequence, and the fourth region R4 may be provided thereon with the first to fourth conductive layers 2010, 2020, 2030, and 2040 stacked in sequence. The lower preliminary work function layer 2100 may thus have a difference in thickness on the first to fourth regions R1 to R4.

In addition, during the process above, the preliminary dielectric layers 1010 and 1030 on the first to third regions R1 to R3 may be exposed to the etching process once, and the preliminary dielectric layers 1010 and 1030 on the fourth region R4 may not be exposed to the etching process. As a result, potential defects may minimally or rarely occur on the preliminary dielectric layers 1010 and 1030 when the etching process is performed.

Figure 12:
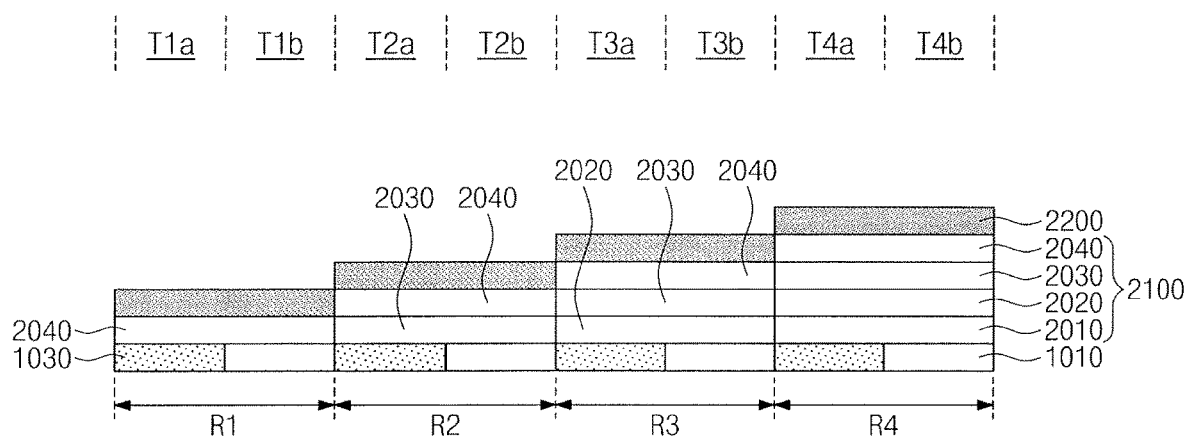

Referring to FIG. 12, an upper preliminary work function layer 2200 may be formed on the first to fourth regions R1 to R4. The upper preliminary work function layer 2200 may include one or more of binary metal material containing aluminum (Al) element, oxide thereof, nitride thereof, and carbide thereof, e.g., TiAlC, TiAlN, TiAlCN, or TiAl.

Figure 13:
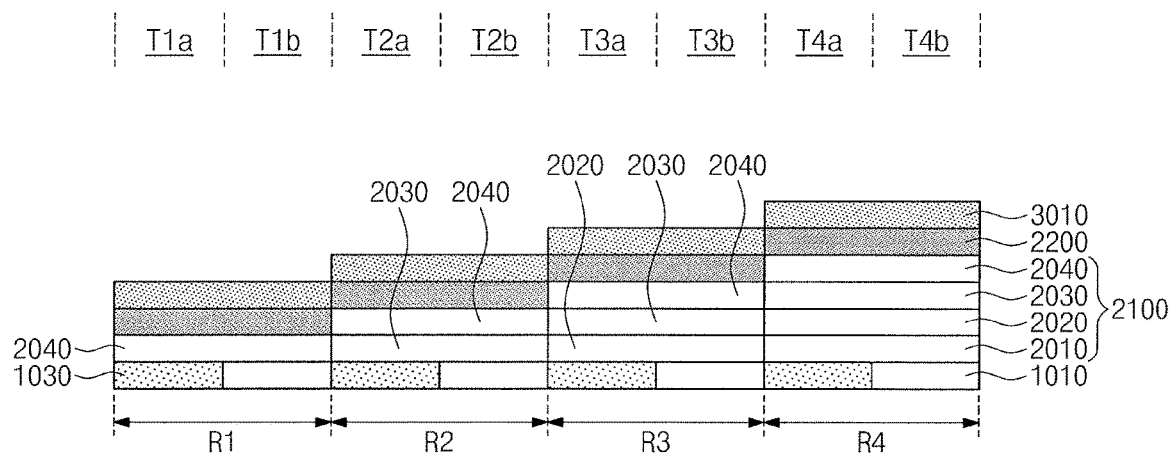

Referring to FIG. 13, a lower barrier layer 3010 may be formed on the first to fourth regions R1 to R4. The lower barrier layer 3010 may include. e.g., titanium nitride (TiN) or titanium (Ti).

Figure 14:
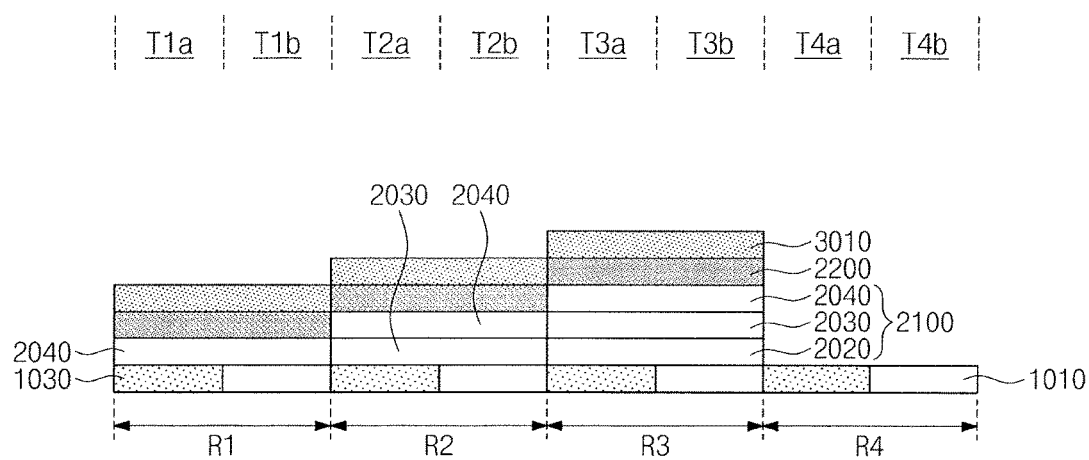

Referring to FIG. 14, an etching process may be performed to remove the first to fourth conductive layers 2010, 2020, 2030, and 2040, the upper preliminary work function layer 2200, and the lower barrier layer 3010 from the fourth region R4. The etching process may expose the preliminary dielectric layers 1010 and 1030 on the fourth region R4.

Figure 15:
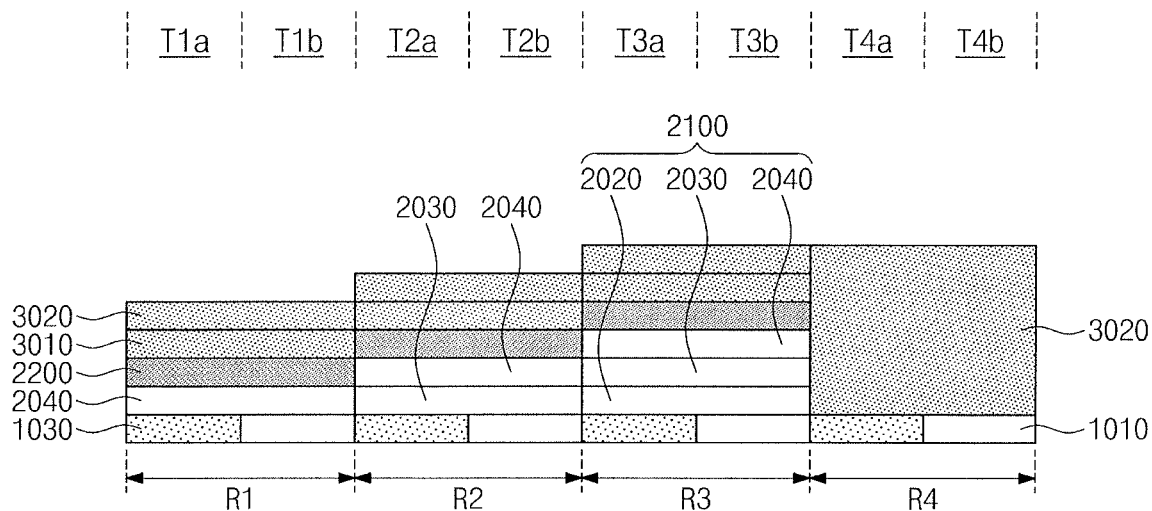

Referring to FIG. 15, an upper barrier layer 3020 may be formed on the first to fourth regions R1 to R4. The upper barrier layer 3020 may have a top surface that is stepwise on the first to third regions R1 to R3, but flat on the third and fourth regions R3 and R4. An etching process may be optionally performed to cause the upper barrier layer 3020 to have the flat top surface on the third and fourth regions R3 and R4. The upper barrier layer 3020 may include, e.g., titanium nitride (TiN) or titanium (Ti), which material may be the same as or different from that of the lower barrier layer 3010.

Figure 16:
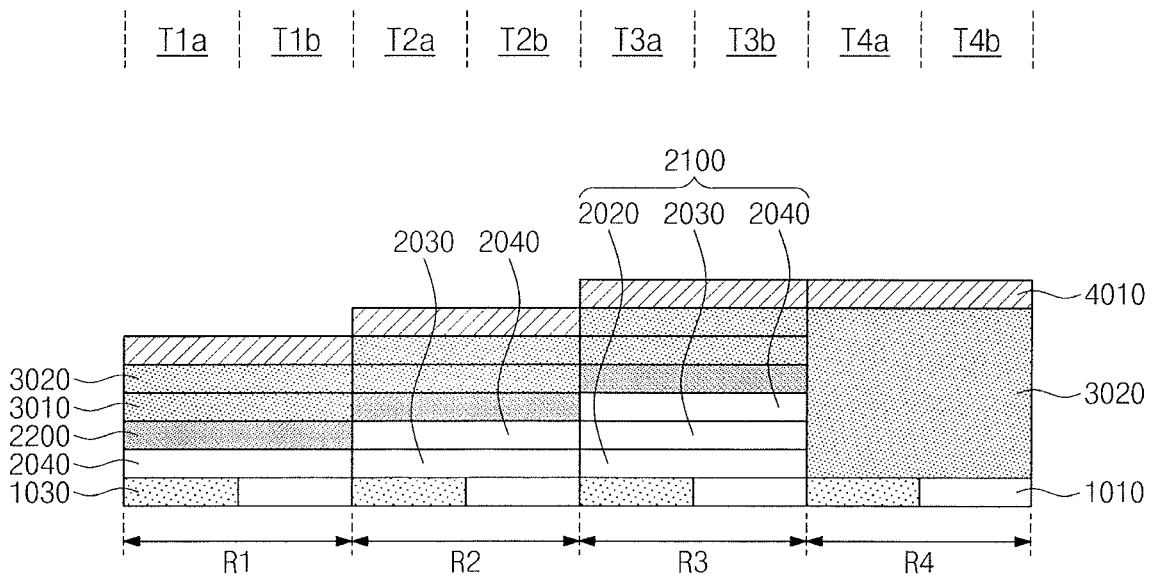

Referring to FIG. 16, a conductive pattern 4010 may be formed on the upper barrier layer 3020. A planarization process may be performed on the substrate 100 of FIG. 1. For example, through the planarization process, the preliminary dielectric layers 1010 and 1030, the lower preliminary work function layer 2100, the upper preliminary work function layer 2200, the lower barrier layer 3010, and the upper barrier layer 3020 may each be separated into the dielectric layers 120, 220, 320, and 420, the lower work function layers 130, 230, and 330, the upper work function layers 140, 240, and 340, and the barrier layers 150, 250, 350, and 450 shown in FIG. 1.

By way of summation and review, MOSFETs may be replaced with high-k dielectric-metal gate structures in which silicon oxide and poly crystalline silicon are respectively used for forming a gate dielectric layer and a gate electrode. Embodiments provide a semiconductor device including transistors having threshold voltages that are different from each other. Embodiments also provide a semiconductor device with compact-sized gate electrodes with improved electrical characteristics.

That is, according to embodiments, a semiconductor device may include a high threshold voltage transistor whose gate electrode has a reduced total thickness, e.g., the fourth transistor T4. In this case, the gate electrode, e.g., without N metal, may be received within a narrow trench, and thus transistors may decrease in thickness. As a result, a semiconductor device may include highly integrated transistors having different threshold voltages.

Furthermore, since work function layers do not need to have great thicknesses to provide the transistor having a great threshold voltage, the gate electrode of the transistor with the great threshold voltage may have low electrical resistance. It thus may be possible to improve electrical characteristics of the transistor and facilitate control of its threshold voltage.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    a substrate having an active region; and
    first to third transistors on the active region of the substrate, each of the first to third transistors including:
        a dielectric layer on the substrate,
        a metal layer on the dielectric layer, and
        a barrier layer between the dielectric layer and the metal layer,
    wherein each of the first and second transistors further includes a work function layer between the dielectric layer and the barrier layer, wherein the barrier layer of the third transistor is in contact with the dielectric layer of the third transistor, and wherein a threshold voltage of the second transistor is greater than a threshold voltage of the first transistor and less than a threshold voltage of the third transistor.

2. The device as claimed in claim 1, wherein a thickness of the work function layer of the second transistor is greater than a thickness of the work function layer of the first transistor.

3. The device as claimed in claim 1, wherein the work function layer of each of the first and second transistors includes a lower work function layer and an upper work function layer on the lower work function layer.

4. The device as claimed in claim 3, wherein:
a thickness of the lower work function layer of the second transistor is greater than a thickness of the lower work function layer of the first transistor, and
a thickness of the upper work function layer of the second transistor is the same as a thickness of the upper work function layer of the first transistor.

5. The device as claimed in claim 1, wherein a thickness of the barrier layer of the third transistor is substantially the same as a sum of a thickness of the work function layer of the first transistor and a thickness of the barrier layer of the first transistor.

6. The device as claimed in claim 1, wherein a top surface of the barrier layer of the third transistor is at a level the same as or lower than that of a top surface of the barrier layer of the second transistor.

7. The device as claimed in claim 1, wherein:
the barrier layer of each of the first and second transistors includes a lower barrier layer and an upper barrier layer on the lower barrier layer, and
the upper barrier layer of each of the first and second transistors includes substantially the same material as that of the barrier layer of the third transistor.

8. The device as claimed in claim 1, wherein:
each of the first to third transistors is provided in plural, and
the dielectric layer of one of the plurality of first transistors, of one of the plurality of second transistors, and of one of the plurality of third transistors further comprises a work function control element.

9. The device as claimed in claim 8, wherein a threshold voltage of the one transistor of the plurality of first transistors that includes the work function control element is less than a threshold voltage of a first transistor of the plurality of first transistors including no work function control element.

* * * * *